United States Patent
Youngner et al.

(10) Patent No.: US 6,900,702 B2
(45) Date of Patent: May 31, 2005

(54) MEMS FREQUENCY STANDARD FOR DEVICES SUCH AS ATOMIC CLOCK

(75) Inventors: Dan W. Youngner, Maple Grove, MN (US); James F. Detry, Plymouth, MN (US); J. David Zook, Golden Valley, MN (US)

(73) Assignee: Honeywell International Inc., Morristown, NJ (US)

( * ) Notice: Subject to any disclaimer, the term of this patent is extended or adjusted under 35 U.S.C. 154(b) by 336 days.

(21) Appl. No.: 10/218,429

(22) Filed: Aug. 14, 2002

(65) Prior Publication Data

US 2004/0084395 A1 May 6, 2004

(51) Int. Cl.[7] .......................... H03B 17/00; H01S 1/06
(52) U.S. Cl. ....................................... 331/94.1
(58) Field of Search ................... 331/3, 94.1

(56) References Cited

U.S. PATENT DOCUMENTS 6,265,945 B1   7/2001  Delaney et al.
6,570,459 B1 *  5/2003  Nathanson et al. ........ 331/94.1

OTHER PUBLICATIONS

S. Knappe et al., "Characterization of coherent population trapping resonances as atomic frequency references." J. Opt. Soc. Am. B, vol. 18, No. 11/Nov. 2001, pp. 1545–1553.

J. Kitching et al., "Optical pumping noise in laser–pumped, all–optical microwave frequency references." J. Opt. Soc. Am. B/vol. 18, No. 11/Nov. 2001, pp. 1676–1683.

J. Kitching et al., "A microwave frequency reference based on VCSEL–driven dark line resonances in Cs vapor", IEEE Trans. Instrum. Meas. 49, 1313–1317 (2000).

* cited by examiner

Primary Examiner—David Mis

(57) ABSTRACT

A frequency standard has a cell formed in a cavity of a substrate. The cell contains a metal alkali vapor. The substrate has an optical path that intersects the cell. A light source is supported by the substrate and supplies light through the first optical path to the cell, and a light detector is supported by the substrate and receives light through the second optical path from the cell. The sealed vapor-filled cell is surrounded by a vacuum cavity enclosure. Bridges between the cell and the substrate may be used to thermally isolate the cell in the cavity and allow closed loop temperature control of the cell.

47 Claims, 3 Drawing Sheets

MEMS FREQUENCY STANDARD FOR DEVICES SUCH AS ATOMIC CLOCK

TECHNICAL FIELD OF THE INVENTION

The present invention relates to a frequency standard that can be used for such devices as atomic clocks.

BACKGROUND OF THE INVENTION

In frequency standards that rely on alkali metal source atoms, such as atoms of cesium 133 or rubidium 85 or 87, a modulatable light source, such as a laser light source, is used to optically pump the source atoms contained in a cell of the frequency standard. A sealed, optically transparent cell contains the source atoms and any buffer gases, and the RF modulated light from the light source is directed through suitable optics into the cell. When the source atoms within the cell absorb light of a particular wavelength that is modulated at a particular modulation frequency, they emit a light signal whose intensity has a sharply defined peak at this wavelength. This light signal is detected as an output of the frequency standard.

This detected light may then be used to control the frequency of the light source emission so that the intensity of the light output from the source atoms is maintained at this peak. Because the peak intensity is very sharply defined, the modulation frequency can then be used to very accurately drive a clock.

Present atomic frequency standards have sizes averaging in the vicinity of 3 inches by 3 inches by 6 inches. Efforts have been made to reduce this size particularly for applications in the fields of telecommunications, satellite navigation transmitters and receivers, and the like.

Once such effort has been directed to a design involving a frame element on which an optical physics package and an electronic control and detection package are mounted. The optical physics package includes a solid state laser source, a linear polarizer, a circular polarizer, a sealed and windowed metallic cell containing the source and buffer gas atoms, and a photodetector. The electronic control and detection package cooperates with the physics package to control and modulate the laser source and to detect the light output. This package is reported to have a size of 1.5 inches by 1.5 inches by 2.5 inches.

The present invention achieves even smaller dimensions by employing MicroElectroMechanical Systems (MEMS) technology in fabricating both the optics and the detection components on the same substrate. The size of the MEMS frequency standard according to the present invention may be on the order of 1.5 mm deep by 1.5 mm high by 2.0 mm long.

SUMMARY OF THE INVENTION

In accordance with one aspect of the present invention, a frequency standard comprises a two-layer substrate made by bonding together first and second substrates, a cell, first and second optical paths, a light source, and a light detector. The cell is formed in a cavity of the substrate, and the cell contains a vapor of metal alkali atoms. The first and second optical paths are formed inside the substrate so as to intersect the cell. The light source is supported by the substrate and supplies light through the first optical path to the cell. The light detector is supported by the substrate and receives light through the second optical path from the cell.

In accordance with another aspect of the present invention, a frequency standard comprises a substrate, a cell, at least first and second bridges, an optical path, a light source, and a light detector. The cell is formed in a cavity of the substrate, and the cell contains metal alkali atoms. The at least first and second bridges suspend the cell within the cavity. The optical path is provided through the substrate, and the optical path intersects the cell. The light source is supported by the substrate and supplies light through the optical path to the cell. The light detector is supported by the substrate and receives light from the cell through the optical path.

In accordance with yet another aspect of the present invention, a method comprises the following: etching a substrate to form an etched volume; forming a transparent oxide wall on the substrate in the etched volume; etching the substrate so as to form a cavity around the wall, so as to form an optical path in the substrate intersecting the wall, and so that the wall is mechanically attached to the substrate by bridges; placing a metal alkali within the wall; providing the substrate with a light source arranged to supply light through the first optical path to the wall; providing the substrate with a light detector arranged to receive light through the second optical path from the wall; and, engaging the substrate with a top cap. The top cap is hermetically sealed to the substrate to proved a vacuum enclosure for the alkali metal vapor cell suspended by bridges.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
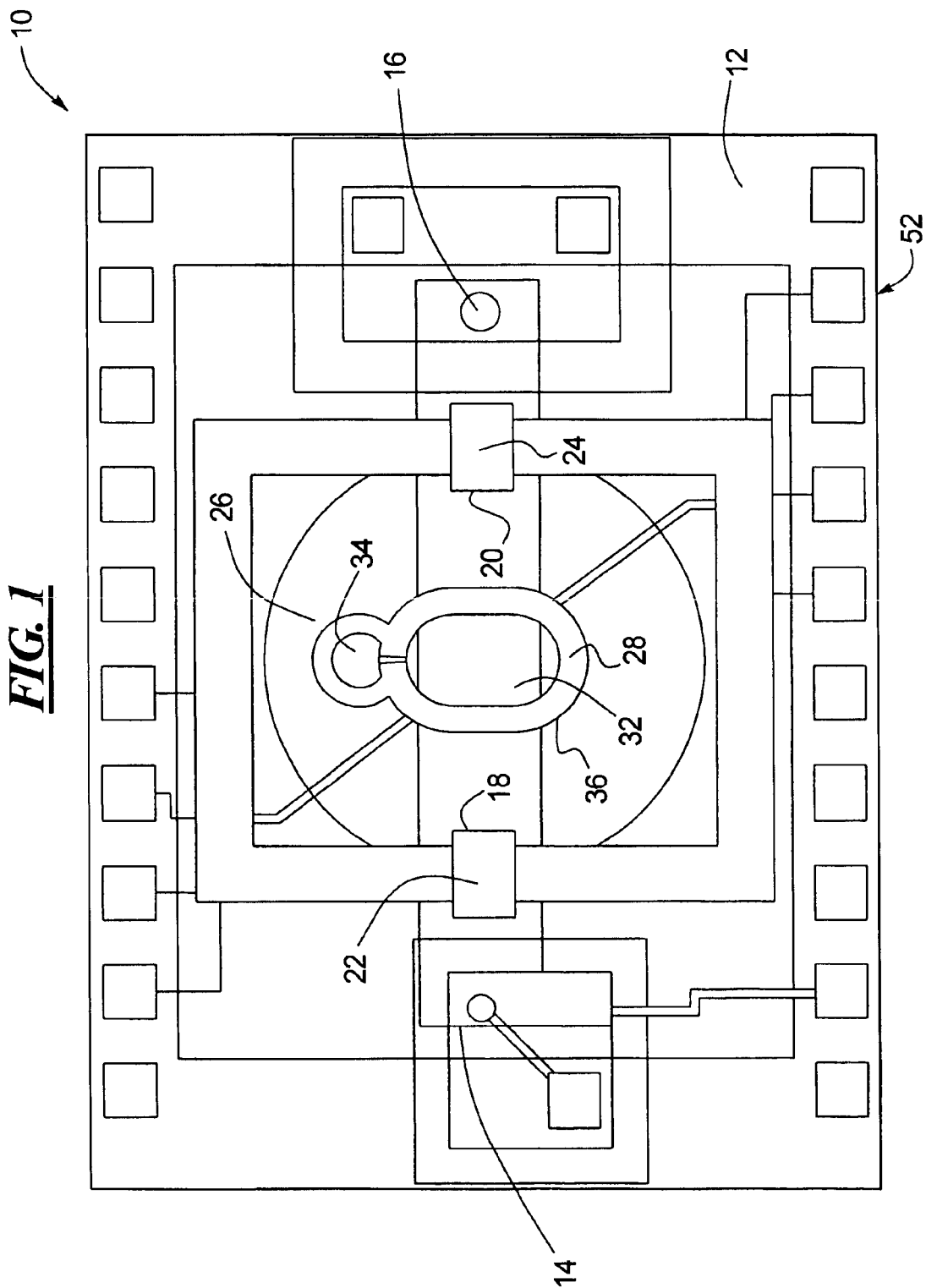
FIG. 1 is a top view of an atomic frequency standard in accordance with the present invention.
Figure 2:
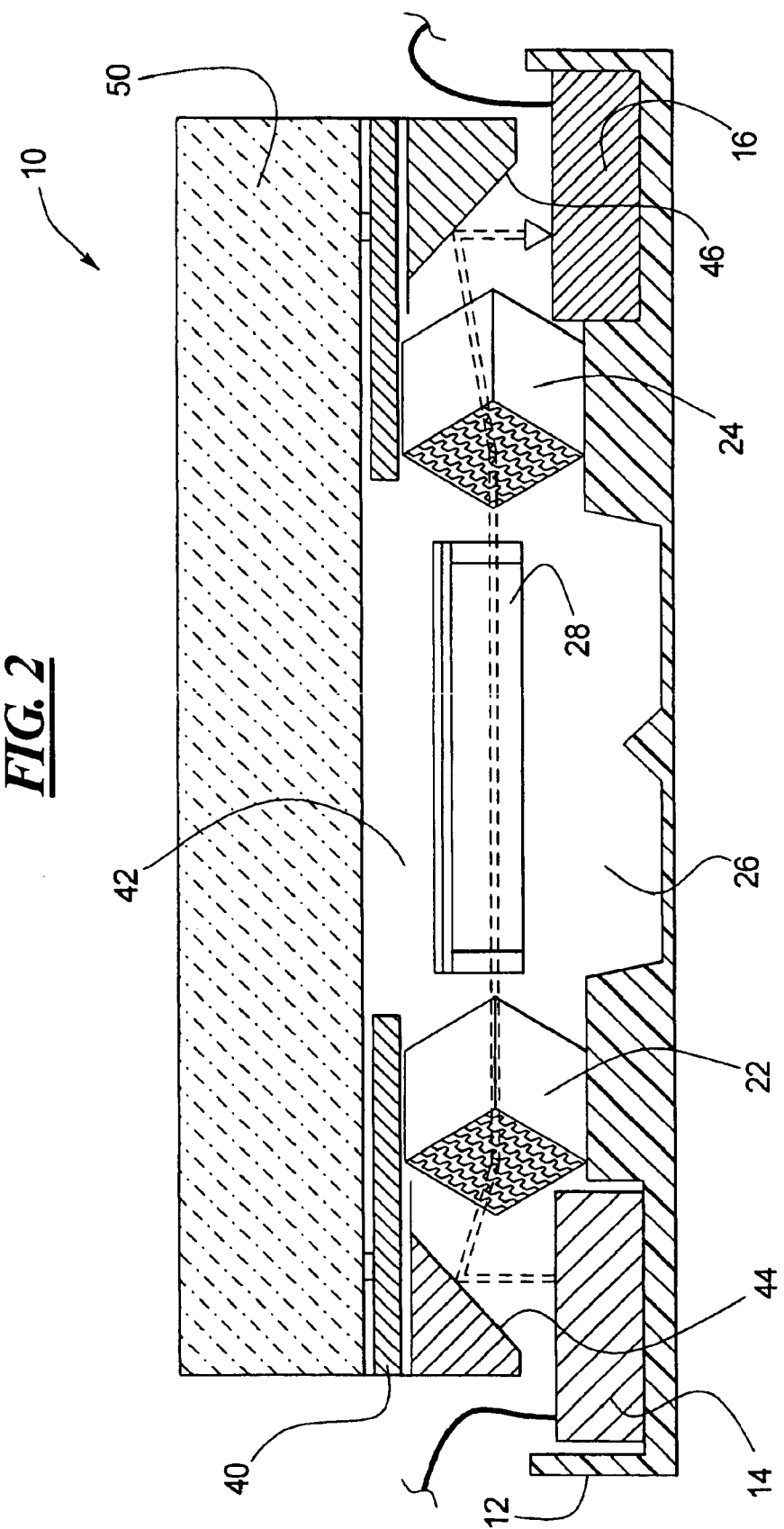
FIG. 2 is a cross-section side view of the atomic frequency standard shown in FIG. 1; and, FIG. 3 is an isometric view of the atomic frequency standard shown in FIG. 1.
Figure 3:
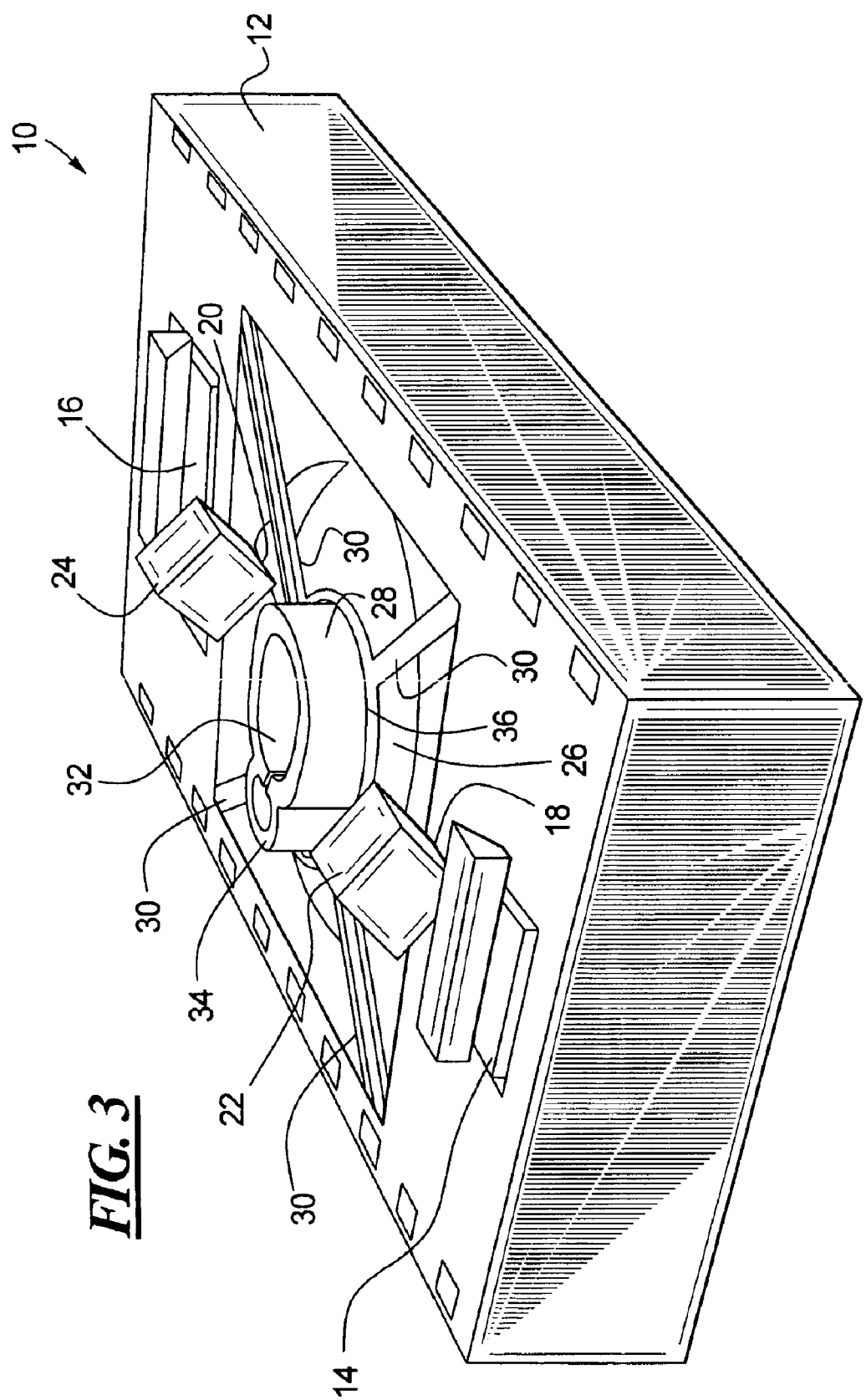

A frequency standard 10 is shown in FIGS. 1, 2, and 3 and includes a lower substrate 12, an upper substrate 40, and a top cap 50. Substrates 12 and 40, for example, may be silicon substrates. A light source 14 is provided in the substrate 12 at one side thereof. The light source 14, for example, may be a vertical cavity surface emitting laser (VCSEL) and can be separately fabricated and inserted into a corresponding well in the substrate 12. Alternatively, the light source 14 can be directly fabricated into the substrate 12 using known integration techniques. Similarly, a light detector 16 is provided in the substrate 12 at another side thereof. The light detector 16, for example, may be a photodiode detector and can be separately fabricated and inserted into a corresponding well in the substrate 12. Alternatively, the substrate 12 can be made from a semiconducting material, and the light detector 16 can be directly fabricated into the substrate 12 using known integration techniques.

During etching of the lower substrate 12, v-shaped containment grooves 18 and 20 are selectively formed to receive first and second optical processors 22 and 24, respectively. Similarly, grooves are etched in upper substrate 40. The first optical processor 22, for example, may include a lens and prism and a quarter wave plate circular polarizer. The lens and prism may be on the side of the cell closer to the light source 14, and the quarter wave plate circular polarizer may be on the other side nearer the detector 16. The second optical processor 24, for example, may include a lens.

Respective hermetic seals are provided between the substrate 12, the first and second optical processors 22 and 24, and the upper substrate 40. For example, the first and second optical processors 22 and 24 may be soldered into the v-shaped containment grooves 18 and 20 so as to form part of the hermetic seals. The hermetic seals allow the cavity 26 to be evacuated so that the alkali metal vapor cell 28 is thermally isolated from the substrates 12 and 40. The transparent top cap 50 is bonded hermetically to the two-layer substrate to provide the vacuum enclosure for the vapor cell 28.

During etching of the substrate 12, a portion of a chamber 26 is formed in the substrate 12. A transparent oxide, such as silicon dioxide, is grown or deposited on the upper substrate 40 forming this portion of the chamber 28. Etching of the substrate 40 is continued so that the top and sides of the cell 28 are formed. The bottom of the cell 28 is suspended from the substrate 12 by bridges 30. The bridges 30, which may be thermal insulating bridges, provide thermal isolation between the cell 28 and the substrates 12 and 40. Deep Reactive Ion Etching (DRIE) can be used for the etching described above. The cell 28 is formed by bonding together the two substrates 40 and 12 with a hermetic seal such as Pb—Sn reflow solder.

The cell 28 has a first cell portion 32 and a second cell portion 34. An alkali metal such as rubidium is deposited in the second cell portion 34 and the alkali metal is capped with a passivation layer such as an aluminum layer. The first and second cell portions 32 and 34 are coupled by a small slit or tunnel. In one embodiment of the present invention, the cap and/or walls of the adjoining layer may be made transparent so that the alkali metal can be heated by a laser so as vaporize the alkali metal. The vapor pressure of the metal alkali is sufficient to cause the vaporized metal alkali to fill the first cell portion 32 to a saturation vapor pressure at the desired temperature, such as 85° C.

In another embodiment of the present invention, the frequency standard 10, when fabricated at least sufficiently for the cell 28 to be sealed, may be placed in an oven and heated to a temperature that causes the metal alkali in the second cell portion 34 to vaporize and that causes the resulting alkali metal vapor to fill the first cell portion 32.

In still another embodiment, a heater 36 in contact with the cell 28 may be energized to heat the metal alkali in the second cell portion 34 sufficiently to cause the metal alkali in the second cell portion 34 to vaporize and to cause the resulting alkali metal vapor to fill the first cell portion 32. It is desirable to closely control the temperature of the cell with low levels of heater power.

The upper substrate 40 is etched to form a chamber 42 above the cell 28, to provide surfaces on which mirrors 44 and 46 may be formed, and to provide v-shaped containment grooves to receive the first and second optical processors 22 and 24. Accordingly, the v-shaped containment grooves formed in the upper substrate 40 align with the v-shaped containment grooves 18 and 20 formed in the substrate 12 in order to contain the first and second optical processors 22 and 24. The mirror 44 directs light from the light source 14 to the first optical processor 22 and through the alkali metal cell 28, and the mirror 46 directs light from the second optical processor 24 to the light detector 16.

The upper substrate 40 is attached to the substrate 12 so that the chamber 42 aligns with the chamber 26 and so that the mirrors 44 and 46 have the relative positions shown in FIG. 2. Standard wafer bonding techniques may be used to attach the upper substrate 40 to the lower substrate 12. The upper substrate 40, for example, may be a semiconductor wafer and/or a silicon wafer. The mirrors 44 and 46, for example, may be fabricated by etching silicon with KOH, a well known anisotropic etch for silicon, producing mirror surfaces.

The cavity formed by the chambers 26 and 42 may be evacuated to form a vacuum around the cell 28. For example, the transparent sealing wafer 50 may be attached to the substrate 12 within a vacuum thereby creating and preserving a vacuum within the cavity 26. Because of the vacuum within this cavity, the thermal path from the cavity to the outside world has a very low thermal conductance. The low thermal conductance makes it possible to keep the temperature of the cavity stable with very little applied power.

Bond pads 52 may be formed on the substrate 12 in order to electrically drive the light source 14, the light detector 16, the heater 36, and/or any electronic connections needed in the frequency standard 10 to external devices.

The first and second optical processors 22 and 24 may employ diffractive optic components. Such components can be made much smaller than their respective refractive counterparts, and are therefore more compatible with a MEMS process. Diffractive optics can be used to redirect, collimate, linearly polarize, and/or circularly polarize the light going into and exiting from the cavity formed by the chambers 26 and 42.

Although it has been conventionally thought in the past that linear polarizers were a required element of frequency standards of the type described herein, a separate linear polarizer is unnecessary if a well polarized VCSEL is used as the light source 14.

The remaining electronics for a device, such as an atomic clock, using the frequency standard 10 may be integrated in either the substrate 12 or the upper substrate 40 or elsewhere.

Accordingly, the MEMS approach described herein for the frequency standard 10 results in the frequency standard 10 having a small size, low mass, and low power requirements. Also, MEMS fabrication offers other advantages such as high volume, low cost batch production and rapid commercialization. Moreover, the design described above has relatively large flat surfaces for solder reflow seals between wafers 12 and 40, and between wafers 40 and 50.

Certain modifications of the present invention have been described above. Other modifications will occur to those practicing in the art of the present invention. For example, the bridges 30 may be silicon nitride.

Also, the bridges 30 may be formed wholly or partially as springs in order to protect the bridges 30 from mechanical shocks. For example, the bridges 30 may be formed into zig-zag patterns that gives slightly when the substrate 12 and the upper substrate 40 are bonded together. By enabling the structure to flex, the process of bonding the substrate 12 and the upper substrate 40 together is made easier and more tolerant of processing imperfections.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A frequency standard comprising:
   a substrate;

a cell formed in a cavity of the substrate, the cell containing metal alkali atoms;

first and second etched optical paths through the substrate, wherein the first and second optical paths intersect the cell;

a light source supported by the substrate so as to supply light through the first optical path to the cell; and, a light detector supported by the substrate so as to receive light through the second optical path from the cell.

2. The frequency standard of claim 1 wherein the cell comprises a transparent oxide.

3. The frequency standard of claim 1 wherein the first optical path comprises a first optical processor, and wherein the second optical path comprises a second optical processor.

4. The frequency standard of claim 3 wherein the first optical processor comprises a first lens and a circular polarizer, and wherein the second optical processor comprises a second lens.

5. The frequency standard of claim 1 wherein the substrate comprises a first containment groove containing a first optical processor in the first optical path, and wherein the substrate comprises a second containment groove containing a second optical processor in the second optical path.

6. The frequency standard of claim 3 wherein the first and second optical processors comprise diffractive optical elements.

7. The frequency standard of claim 1 wherein the substrate comprises a first substrate and a second substrate engaging one another to form a cavity containing the cell.

8. The frequency standard of claim 7 wherein the cell comprises a transparent oxide.

9. The frequency standard of claim 7 wherein the first optical path comprises a first optical processor, and wherein the second optical path comprises a second optical processor.

10. The frequency standard of claim 9 wherein the first optical processor comprises a first lens and a circular polarizer, and wherein the second optical processor comprises a second lens.

11. The frequency standard of claim 9 wherein the first substrate and the second substrate comprise first complementary containment grooves containing the first optical processor, and wherein the first substrate and the second substrate comprise second complementary containment grooves containing the second optical processor.

12. The frequency standard of claim 11 wherein the cell comprises a transparent oxide.

13. The frequency standard of claim 9 wherein the first optical path comprises a first mirror formed in the second substrate between the light source and the first optical processor, wherein the first mirror is arranged to direct light from the light source to the first optical processor, wherein the second optical path comprises a second mirror formed in the second substrate between the light detector and the second optical processor, and wherein the second mirror is arranged to direct light from the second optical processor to the light detector.

14. The frequency standard of claim 13 wherein the first substrate and the second substrate comprise first complementary containment grooves containing the first optical processor, and wherein the first substrate and the second substrate comprise second complementary containment grooves containing the second optical processor.

15. The frequency standard of claim 1 further comprising a heater in thermal communication with the cell.

16. The frequency standard of claim 1 wherein the first optical path comprises a first mirror, wherein the first mirror is arranged to direct light from the light source toward the cell, wherein the second optical path comprises a second mirror, and wherein the second mirror is arranged to direct light from the cell to the light detector.

17. The frequency standard of claim 1 further comprising a cap hermetically sealed to the substrate so as to enclose the alkali metal cell in a vacuum supported by a plurality of bridges to the substrate.

18. The frequency standard of claim 17 wherein the bridges have conductors to monitor and control the temperature of the alkali metal cell.

19. A frequency standard comprising:

a substrate;

a cell formed in a cavity of the substrate, the cell containing metal alkali atoms;

first and second optical paths through the substrate, wherein the first and second optical paths intersect the cell;

a light source supported by the substrate so as to supply light through the first optical path to the cell;

a light detector supported by the substrate so as to receive light through the second optical path from the cell; and, wherein the substrate comprises a first containment groove containing a first optical processor in the first optical path, and wherein the substrate comprises a second containment groove containing a second optical processor in the second optical path.

20. The frequency standard of claim 19 wherein the cell comprises a transparent oxide.

21. The frequency standard of claim 19 wherein the first optical path comprises a first mirror, wherein the first mirror is arranged to direct light from the light source to the first optical processor, wherein the second optical path comprises a second mirror, and wherein the second mirror is arranged to direct light from the second optical processor to the light detector.

22. The frequency standard of claim 19 wherein the first and second optical paths comprise corresponding first and second etched optical paths.

23. A frequency standard comprising:

a substrate;

a cell formed in a cavity of the substrate, wherein the cell contains metal alkali atoms;

at least first and second bridges suspending the cell within the cavity;

an optical path that intersects the cell;

a light source supported by the substrate so as to supply light through the optical path to the cell; and, a light detector supported by the substrate so as to receive light from the cell through the optical path.

24. The frequency standard of claim 23 wherein the cell comprises a transparent material such as an oxide, a nitride, or an organic material.

25. The frequency standard of claim 23 wherein the optical path comprises a first optical processor between the light source and the cell, and wherein the optical path comprises a second optical processor between the cell and the light detector.

26. The frequency standard of claim 25 wherein the substrate comprises a first containment groove containing the first optical processor, and wherein the substrate comprises a second containment groove containing the second optical processor.

27. The frequency standard of claim 25 wherein the optical path comprises first and second mirrors, wherein the first mirror is arranged to direct light from the light source to the first optical processor, and wherein the second mirror is arranged to direct light from the second optical processor to the light detector.

28. The frequency standard of claim 27 wherein the substrate comprises a first containment groove containing the first optical processor, and wherein the substrate comprises a second containment groove containing the second optical processor.

29. The frequency standard of claim 25 wherein the first and second optical processors comprise diffractive optical elements.

30. The frequency standard of claim 23 wherein the substrate comprises a first substrate and a second substrate engaging one another to form a cavity containing the cell.

31. The frequency standard of claim 30 wherein the optical path comprises a first optical processor between the light source and the cell, and wherein the optical path comprises a second optical processor between the cell and the light detector.

32. The frequency standard of claim 31 wherein the first substrate and the second substrate comprise first complementary containment grooves containing the first optical processor, and wherein the first substrate and the second substrate comprise second complementary containment grooves containing the second optical processor.

33. The frequency standard of claim 31 wherein the optical path comprises a first mirror formed in the second substrate between the light source and the first optical processor, wherein the first mirror is arranged to direct light from the light source to the first optical processor, wherein the optical path further comprises a second mirror formed in the second substrate between the light detector and the second optical processor, and wherein the second mirror is arranged to direct light from the second optical processor to the light detector.

34. The frequency standard of claim 33 wherein the first substrate and the second substrate comprise first complementary containment grooves containing the first optical processor, and wherein the first substrate and the second substrate comprise second complementary containment grooves containing the second optical processor.

35. The frequency standard of claim 23 further comprising a heater in thermal communication with the cell.

36. The frequency standard of claim 23 wherein the first optical path comprises a first mirror, wherein the first mirror is arranged to direct light from the light source toward the cell, wherein the second optical path comprises a second mirror, and wherein the second mirror is arranged to direct light from the cell to the light detector.

37. The frequency standard of claim 24 wherein the first and second bridges comprise respective springs.

38. A method comprising:

etching a first substrate so that a cell wall is mechanically attached to the substrate by bridges;

etching a second substrate to form an etched volume;

forming a transparent oxide wall on the second substrate in the etched volume;

etching the second substrate so as to form a cavity around the wall, so as to form an optical path in the substrate intersecting the wall;

placing a metal alkali within the wall;

engaging the first and second substrates so as to form a sealed cell for the alkali metal;

providing the sealed substrates with a light source arranged to supply light through a first optical path to the cell;

providing the substrate with a light detector arranged to receive light through a second optical path from the cell.

39. The method of claim 38 further comprising:

providing the optical path with a first optical processor between the light source and the wall; and, providing the optical path with a second optical processor between the wall and the light detector.

40. The method of claim 39 further comprising:

forming a first mirror in the second substrate, wherein the first mirror is arranged to direct light from the light source to the first optical processor; and, forming a second mirror in the second substrate, wherein the second mirror is arranged to direct light from the second optical processor to the light detector.

41. The method of claim 39 further comprising:

containing the first optical processor in a first containment groove within the first substrate; and, containing the second optical processor in a second containment groove within the first substrate.

42. The method of claim 39 further comprising:

containing the first optical processor in complementary first containment grooves formed within the first substrate and the second substrate; and, containing the second optical processor in complementary second containment grooves formed within the first substrate and the second substrate.

43. The method of claim 39 wherein the first and second optical processors comprise diffractive optical elements.

44. The method of claim 38 further comprising:

forming a first mirror in the second substrate to receive light from the light source; and, forming a second mirror in the second substrate to direct light to the light detector.

45. The method of claim 38 further comprising heating the metal alkali to form a vapor.

46. The method of claim 38 wherein the etching of the substrate so that the wall is mechanically attached to the substrate by bridges comprises etching the substrate so as to form bridges with zig-zag patterns.

47. A frequency standard comprising first and second substrates, wherein each of the first and second substrates has a chamber, and wherein the first and second substrates are joined directly together so that the chambers of the first and second substrates define a cavity;

a cell formed in the cavity, wherein the cell contains metal alkali atoms;

first and second optical paths through at least one of the first and second substrates, wherein the first and second optical paths intersect the cell;

a light source supported by at least one of the first and second substrates so as to supply light through the first optical path to the cell; and, a light detector supported by at least one of the first and second substrates so as to receive light through the second optical path from the cell.

* * * * *

UNITED STATES PATENT AND TRADEMARK OFFICE
CERTIFICATE OF CORRECTION

PATENT NO.        : 6,900,702 B2                                Page 1 of 1
APPLICATION NO.   : 10/218429
DATED             : May 31, 2005
INVENTOR(S)       : Youngner et al.

It is certified that error appears in the above-identified patent and that said Letters Patent is hereby corrected as shown below:

In the Specification

At Column 1, Line 4, please insert: --STATEMENT REGARDING FEDERALLY SPONSORED RESEARCH OR DEVELOPMENT
This invention was made with Government support under N66001-02-C-8019 awarded by SPAWAR Systems Center San Diego. The Government has certain rights in the invention.--

Signed and Sealed this
Twenty-sixth Day of May, 2015

Michelle K. Lee
*Director of the United States Patent and Trademark Office*